(12) United States Patent
Kim et al.

(10) Patent No.: US 6,429,472 B2
(45) Date of Patent: Aug. 6, 2002

(54) SPLIT GATE TYPE FLASH MEMORY

(75) Inventors: Byung-ki Kim; Won-il Ryu, both of Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/801,731

(22) Filed: Mar. 9, 2001

(30) Foreign Application Priority Data

Mar. 16, 2000 (KR) .............................................. 00-13346

(51) Int. Cl.[7] .............................................. H01L 29/72
(52) U.S. Cl. ..................... 257/295; 257/314; 257/315; 257/316; 257/366; 257/401
(58) Field of Search ................................. 257/295, 314, 257/316, 401, 366

(56) References Cited

U.S. PATENT DOCUMENTS 5,168,465 A * 12/1992 Harari ........................ 257/320

\* cited by examiner

*Primary Examiner*—Edward Wojciechowicz
(74) *Attorney, Agent, or Firm*—Lee & Sterba, P.C.

(57) ABSTRACT

A split gate type flash memory having an active region that improves an endurance characteristic along with program/erase efficiency, wherein the split gate type flash memory provides for improvement in the endurance characteristic and program/erase efficiency by making the width of an active region in a portion in which a source is overlapped by a floating gate as large as possible.

2 Claims, 7 Drawing Sheets

SPLIT GATE TYPE FLASH MEMORY

BACKGROUND OF THE INVENTION

1. Field of the Invention

The present invention relates to a split gate type flash memory. More particularly, the present invention relates to a split gate type flash memory having the shape of an active region that improves an endurance characteristic as well as program/erase efficiency.

2. Description of the Related Art

As shown in FIG. 1, a split gate type flash memory has a structure wherein a floating gate 22 and a control gate 29 are separated from each other. The floating gate 22 is electrically insulated from the outside. Adjacent the floating gate 22 is an intergate insulating layer 25 and a gate insulating layer 20. Information is stored in a memory cell by using the properties that current in a memory cell changes depending on electron injection (program)/electron discharge (erase) into/from the floating gate 22. Electron injection of hot electrons in a channel 18 into the floating gate 22 is performed by a channel hot electron injection (CHEI) mechanism. Electron discharge is carried out by Fowler-Nordheim (F-N) tunneling through a tunnel insulating layer 24 between the floating gate 22 and the control gate 29. In connection with the electron injection (program) and electron discharge (erase), a voltage distribution is explained in an equivalent capacitor model shown in FIG. 2.

In the electron injection (program) operation, a voltage Vwl is applied to the control gate 29 such that, when the voltage of a source 14 is about Vs=11 V and the voltage of a drain 16 is about Vbl=0 V, the channel 18 opens slightly. In this case, a voltage corresponding to about Vs″Cs/Ctot is applied to the floating gate 22, where Cs, Ctun, and Cgox denote capacitances and Cs+Ctun+Cgox=Ctot. Accordingly, Cs/Ctot is an important factor for determining the efficiency of a cell. Since the voltage Vf which is applied to the floating gate 22 generates a vertical field by which hot electrons are injected into the floating gate 22, the value of this voltage must be increased in order to increase electron injection (program) efficiency.

In the electron discharge (erase) operation, F-N tunneling through the tunnel insulating layer 24 made of an interpoly oxide is used. In this case, voltages of Vs=0 V and Vwl=15 V are applied. Here, the voltage of the floating gate 22 is proportional to (Ctot−Cs−Cgox)/Ctot. Thus, in order to increase an effective voltage (Vwl−Vf), Cs has to be increased, and Ctun has to be reduced. An effective voltage in the electron discharge operation significantly affects the endurance characteristic of a cell as well as the electron discharge (erase) efficiency. In the F-N tunneling mechanism through the tunnel insulating layer 24 made of an interpoly oxide, a reduction in tunnel current caused by electron traps in an insulating layer is known to be a major cause of degradation. This degradation can be suppressed by an increase in effective voltage. Accordingly, if materials of an insulating layer are the same, each capacitance depends on a cell structure, in particular the thickness and area of the insulating layer. On-going efforts are being made in order to overcome this drawback.

As shown in FIG. 3, a conventional split gate cell has a structure in which the width of an active region is uniform like in the existing metal oxide semiconductor field effect transistor (MOSFET). The capacitance Cs affects the area A, which is formed by expanding the source 14 so that it is overlapped by the floating gate 22, and the thickness of a gate insulating layer 20 (not shown). There is, however, a limitation in reducing the thickness of the gate insulating layer and increasing the expansion length of the source 14. As a result, the conventional split gate cell has a disadvantage in that it is difficult to increase the capacitance Cs. Additionally depicted in FIG. 3 are a control gate 29, a channel 18, and a drain 16.

FIG. 4 indicates that during an electron discharge operation of a split gate type flash memory the current Ids is reduced by electron traps as the number of electron injection/discharge cycles, i.e., the number of program/erase cycles is increased. Such an endurance failure in a split gate type memory cell is known to result from a reduction in tunneling current during electron discharge. However, it is impossible to completely remove this phenomenon because the phenomenon is intrinsic due to electron traps formed by an interpoly tunnel insulating layer being of poor quality and thick compared with the gate insulating layer. Accordingly, a cell having a structure addressing this point needs to be adopted.

SUMMARY OF THE INVENTION

To solve at least the above problem, it is a feature of at least one embodiment of the present invention to provide a split gate type flash memory having an active region which increases, and thereby improves, the program/erase efficiency and the endurance characteristic.

Another feature of at least one embodiment of the present invention provides a split gate type flash memory including a substrate; a source, a drain and a channel provided over the substrate; a gate insulating layer provided on the source, the drain and the channel; a floating gate stacked on the gate insulating layer overlying the source and channel; an intergate insulating layer and a tunnel insulating layer stacked on the top and the side of the floating gate, respectively; and a control gate stacked on the intergate insulating layer, the tunnel insulating layer, and the gate insulating layer. In this split gate type flash memory, an active region is formed so that the channel width under the floating gate is larger than the channel width under the control gate.

Another feature of an embodiment of the present invention provides a split gate type flash memory including a substrate; a source, a drain and a channel provided over the substrate; a gate insulating layer provided on the source, the drain and the channel; a floating gate stacked on the gate insulating layer overlying the source and channel; an intergate insulating layer and a tunnel insulating layer stacked on the top and the side of the floating gate, respectively; and a control gate stacked on the intergate insulating layer, the tunnel insulating layer and the gate insulating layer. In this split gate type flash memory, an active region is formed so that the source underlying the floating gate is larger than the width of the channel under the control gate.

Yet another feature of an embodiment of the present invention provides a split gate type flash memory including a substrate; a source, a drain and a channel provided over the substrate; a gate insulating layer provided on the source, the drain and the channel; a floating gate stacked on the gate insulating layer overlying the source and channel; an intergate insulating layer and a tunnel insulating layer stacked on the top and the side of the floating gate, respectively; and a control gate stacked on the intergate insulating layer, the tunnel insulating layer and the gate insulating layer. Furthermore, in this split gate type flash memory, an active region is formed so that the width of the channel under the floating gate is larger than the width of the channel under the control gate, and the source underlying the floating gate is larger than the width of the channel under the control gate.

These and other features of the embodiments of the present invention will be readily apparent to those of ordinary skill in the art upon review of the detailed description of the preferred embodiments that follows.

BRIEF DESCRIPTION OF THE DRAWINGS

The above features and advantages of one or more of the embodiments of the present invention will become more apparent by describing in detail a preferred embodiment thereof with reference to the attached drawings in which like reference characters indicate like elements and in which.

DETAILED DESCRIPTION OF THE PREFERRED EMBODIMENTS

Figure 1:
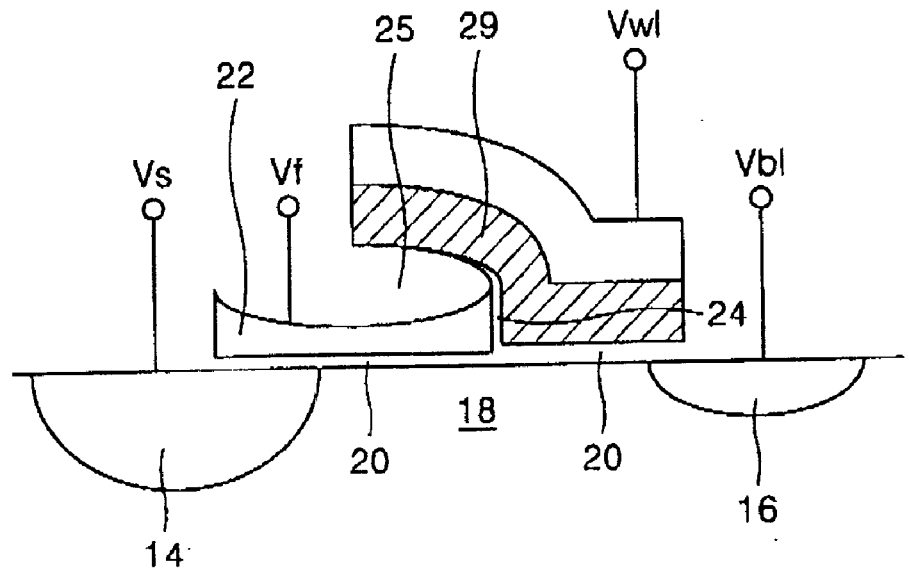
FIG. 1 illustrates a vertically cross-sectional view showing the configuration of a typical split gate type flash memory cell.
Figure 2:
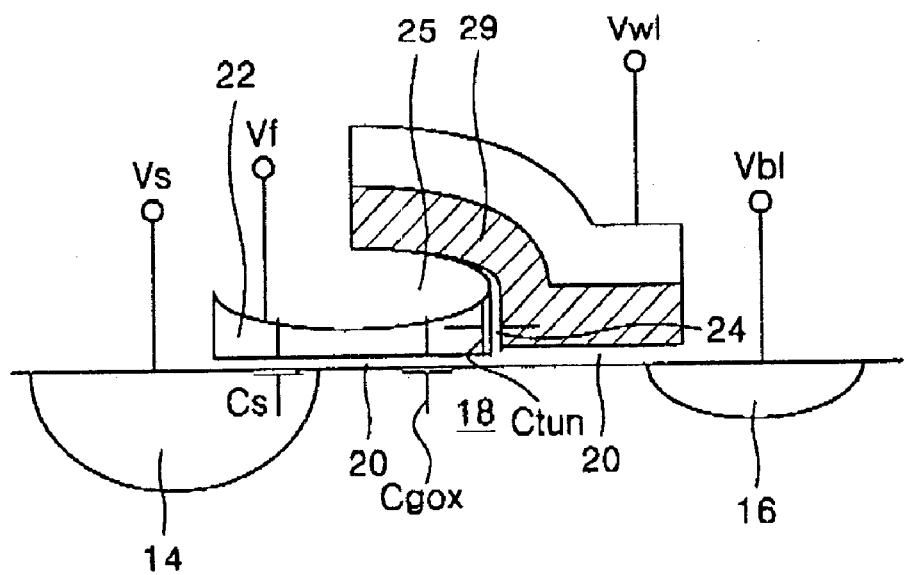
FIG. 2 illustrates a diagram showing a capacitor model of the split gate type memory cell of FIG. 1.
Figure 3:
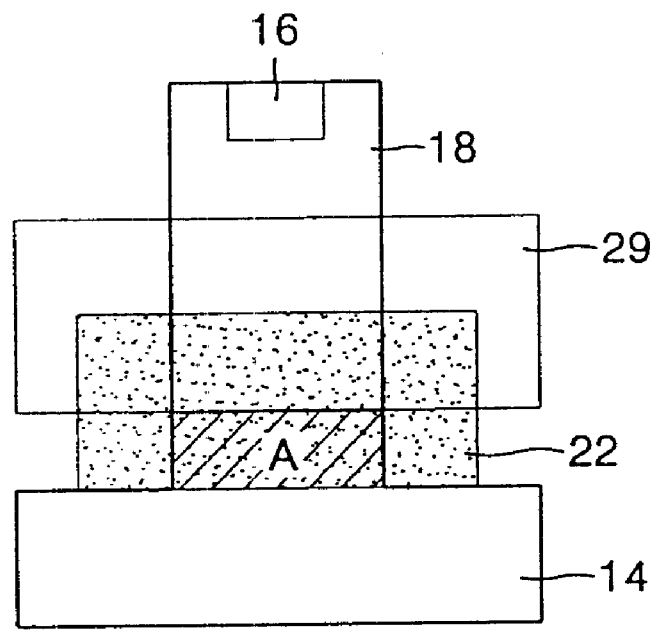
FIG. 3 illustrates a schematic projected plan view depicting an active region of a conventional split gate type memory cell known in the prior art.

Korean patent application number 00-13346, filed on Mar. 16, 2000, and entitled: "Split Gate Type Flash Memory," is incorporated by reference herein in its entirety.

Several embodiments of the present invention will now be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those of ordinary skilled in the art. In the drawings, the thicknesses of layers and regions are exaggerated for clarity. It will also be understood that when a layer is referred to as being "on" or "over" another layer or substrate, it can be directly on the other layer or substrate, and one or more intervening layers may also be present. Further, it will be understood that when a layer is referred to as being "under" another layer, it can be directly under, and one or more intervening layers may also be present.

Figure 5A:
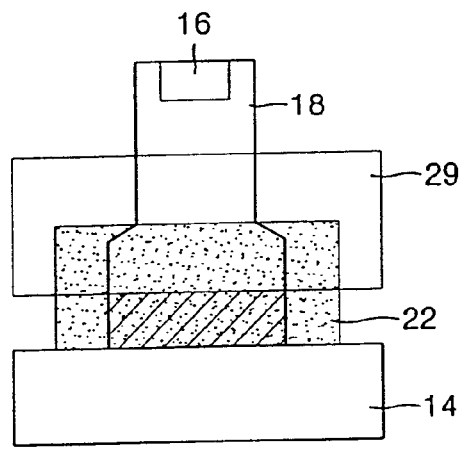
FIGS. 5A–5C illustrate a series of schematic projected plan views depicting active regions of split gate type memory cells according to various embodiments of the present invention.
Figure 5B:
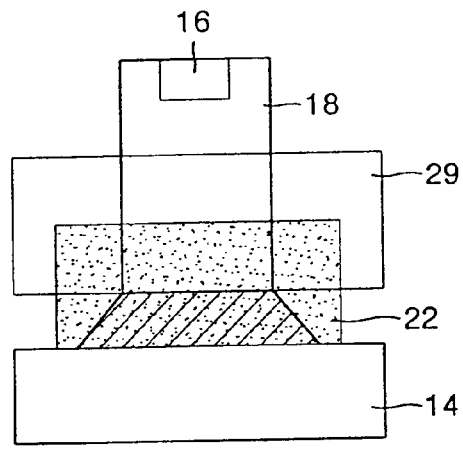
Figure 5C:
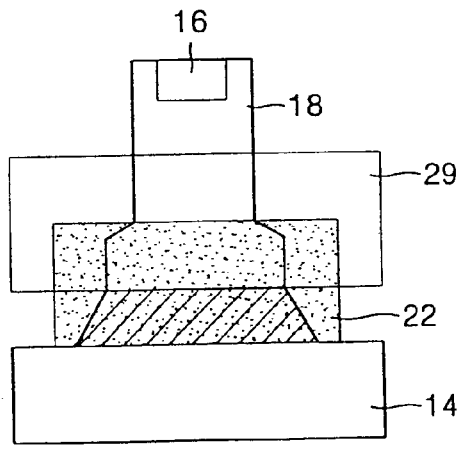

A split gate type flash memory according to an embodiment of the present invention has a distinctive feature in that the width of an active region is increased as it goes to a source. This feature improves the endurance characteristic of the memory and the program/erase efficiency. Embodiments in which an active region is increased are shown in FIGS. 5A–5C. FIGS. 5A–5C depict a source 14, a floating gate 22, a control gate 29, a channel 18 and a drain 16. Additionally, the cross-hatched region depicts the area wherein the expanding source is overlapped by the floating gate.

More specifically, the shape of an active region of a split gate memory cell according to a first embodiment, shown in FIG. 5A, is changed by a fabricating process, as shown in FIGS. 6A–6F, to make the width of a channel 18 under a floating gate 22 larger than that of the channel 18 under a control gate 29.

Furthermore, the width of an active region of a split gate memory cell according to a second embodiment is made as large as possible by increasing a portion of a source 14, which is overlapped by the floating gate 22, as shown in FIG. 5B.

In the first embodiment, since conductance of the floating gate 22 becomes larger when a threshold voltage Vth of the floating gate 22 is increased by electron traps, as compared to a conventional flash memory cell, reduction in current during a reading operation can be suppressed. This reduction is current provides for the improvement in the endurance characteristic. The endurance characteristic for program/erase data is usually expressed as a ratio of current after a cycle stress to initial current. The split gate type cell can be understood as a series connection of two metal oxide semiconductor field effect transistors (MOSFETs). In simpler terms, this can be also understood as a series connection of resistance which is expressed in the following Equation (1):

$$Rcell = r1(\text{floating gate}) + r2(\text{control gate})$$

$$Ids = Vds/(r1+r2) \qquad (1)$$

where Rcell denotes a cell resistance and Ids denotes a drain current.

Figure 4:
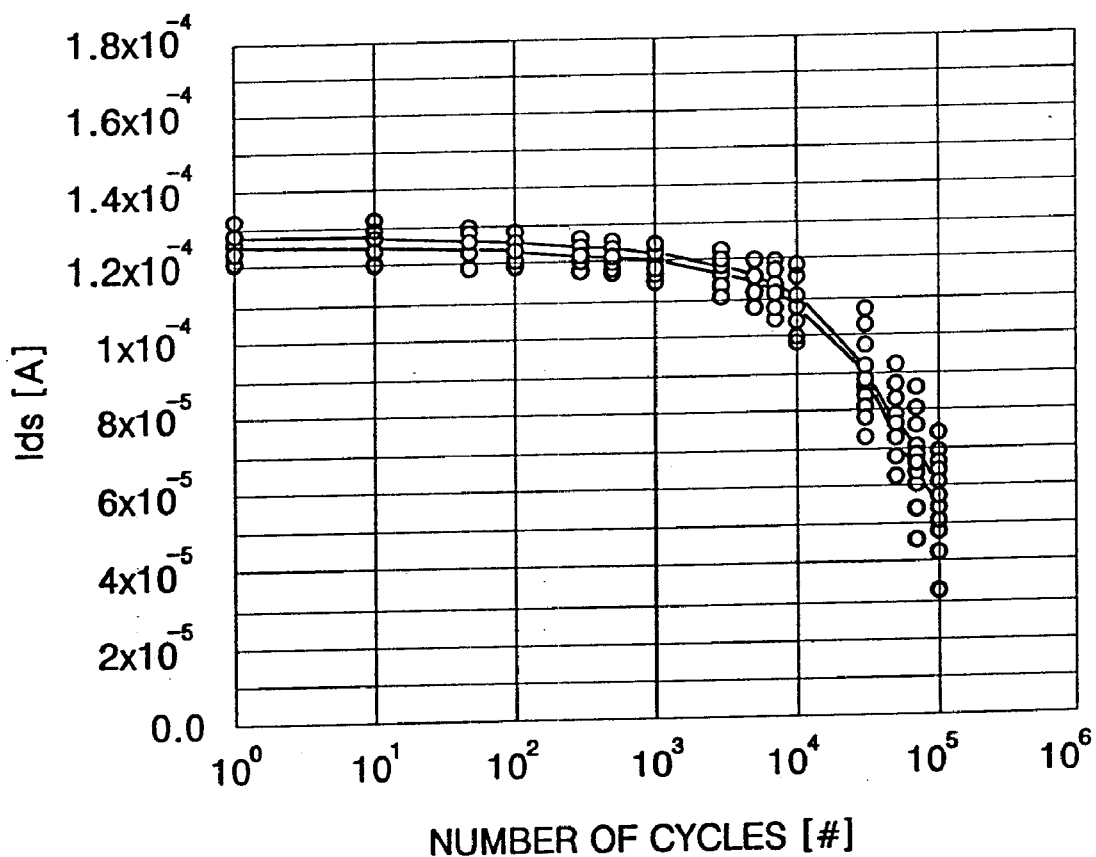
FIG. 4 is a graph depicting an endurance characteristic of the split gate type memory cell of FIG. 3.

It can be found that a reduction in the value of Ids shown in FIG. 4 is caused by the change of a cell resistance, Rcell. In this case, assuming that r2, which is the resistance of a channel under a control gate, is almost constant, reducing the effect of r1 by making it as small as possible is effective in improving the endurance characteristic. Furthermore, assuming that a cell resistance $Rcell = r2(\alpha k+1)$, a change in the cell resistance Rcell with respect to a specific value $\alpha$ can be lessened by lowering the value of k (k equals r1/r2). In this case, $\alpha$ denotes an increase in r1 with respect to the number of program/erase cycles. Thus, when it comes to the value of $\alpha$, an initial value is 1. The value of $\alpha$ is increased as the degree to which the channel of a floating gate is opened is reduced by electron trapping. Given the fact that resistance r in a MOSFET is inversely proportional to a channel width W and is proportional to a channel length L, if the width of a channel under the floating gate is larger than that of the channel under the control gate, the value of k is reduced. This reduction in the value of k provides for improvement in the endurance characteristic. In this case, it is not desirable to change the length of a channel in order to achieve the above purpose since it causes a change in the overall size of a cell.

Moreover, in a memory cell according to the second embodiment, Cs is large as compared with the conventional memory cell, which makes program efficiency better for the reason described above. In addition, the erase efficiency and endurance characteristic are significantly improved.

Although it is possible to apply the first and second embodiments separately, it is more preferable to apply a third embodiment in which the expanded active regions in the first and second embodiments are adopted at the same time. FIG. 5C illustrates a schematic projected plan view depicting an active region adopted in the third embodiment. A manufacturing process of a cell in the embodiment is performed as shown in FIGS. 6A–6F, see, for example, U.S. Pat. No. 5,242,848.

Figure 6A:
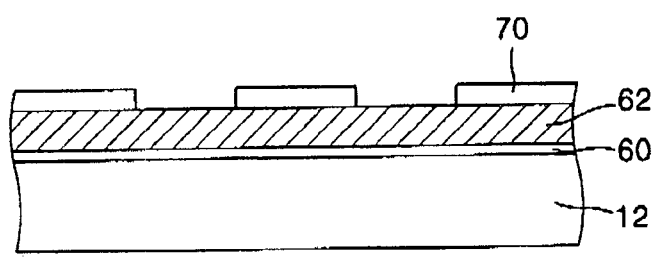
FIGS. 6A–6F illustrate vertical, cross-sectional views depicting a method of manufacturing the split gate type memory cells of FIGS. 5A–5C.
Figure 6B:
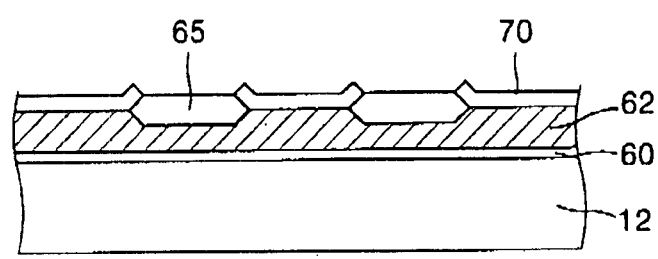
Figure 6C:
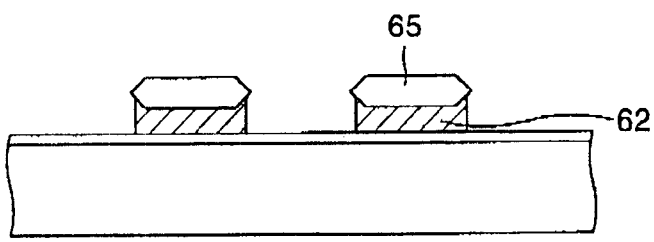
Figure 6D:
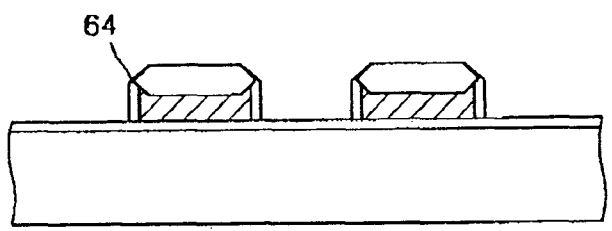
Figure 6E:
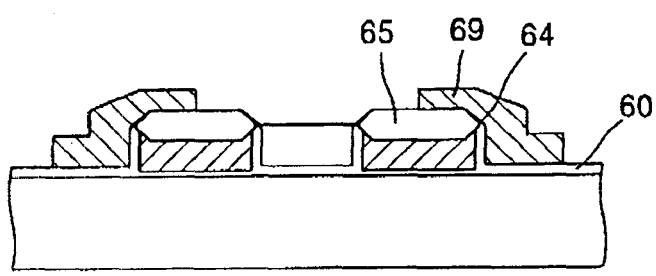
Figure 6F:
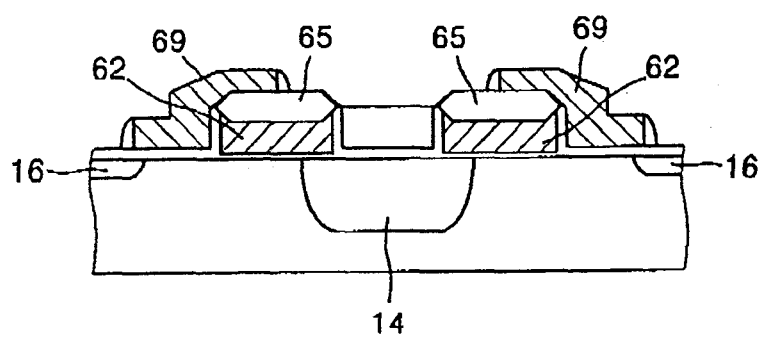

Turning now to FIGS. 6A–6F, first, as shown in FIG. 6A, a gate oxide 60 is formed over a silicon substrate 12, on top of which a polysilicon layer 62 and a nitride layer are sequentially deposited. After the nitride layer is selectively etched by a photolithography process to form a nitride mask pattern 70, an oxide layer 65 is deposited over the exposed polysilicon layer 62 as shown in FIG. 6B. Next, as shown in FIG. 6C, the polysilicon layer 62 and nitride mask pattern 70 are removed by etching to leave only the polysilicon layer 62 underlying the oxide layer 65. Then, as shown in FIG. 6D, an interpoly tunnel insulating layer 64 is formed. As shown in FIG. 6E, a control gate 69 is provided on the oxide layer 65, the interpoly tunnel insulating layer 64 and the gate oxide 60. Finally, as shown in FIG. 6F, impurities are doped between the adjacent polysilicon layer 62 and oxide layer 65 to form a source 14 and a drain 16, thereby completing a cell.

Figure 7:
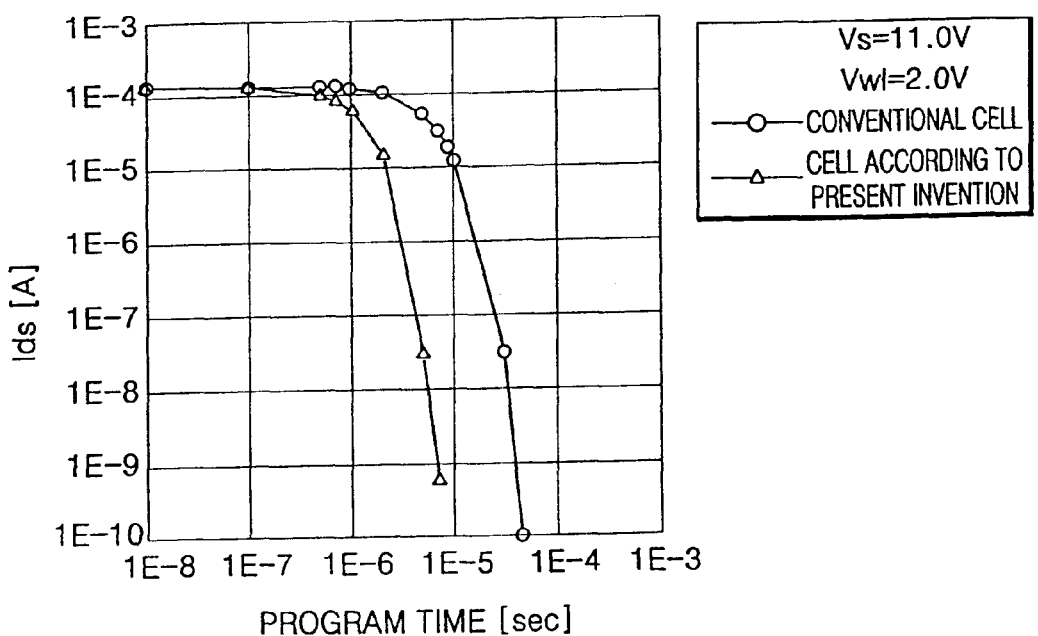
FIG. 7 is a graph depicting electron injection characteristics of the split gate type memory cell according to the embodiment of the present invention of FIG. 5C and the conventional split gate type memory cell of FIG. 3.
Figure 8:
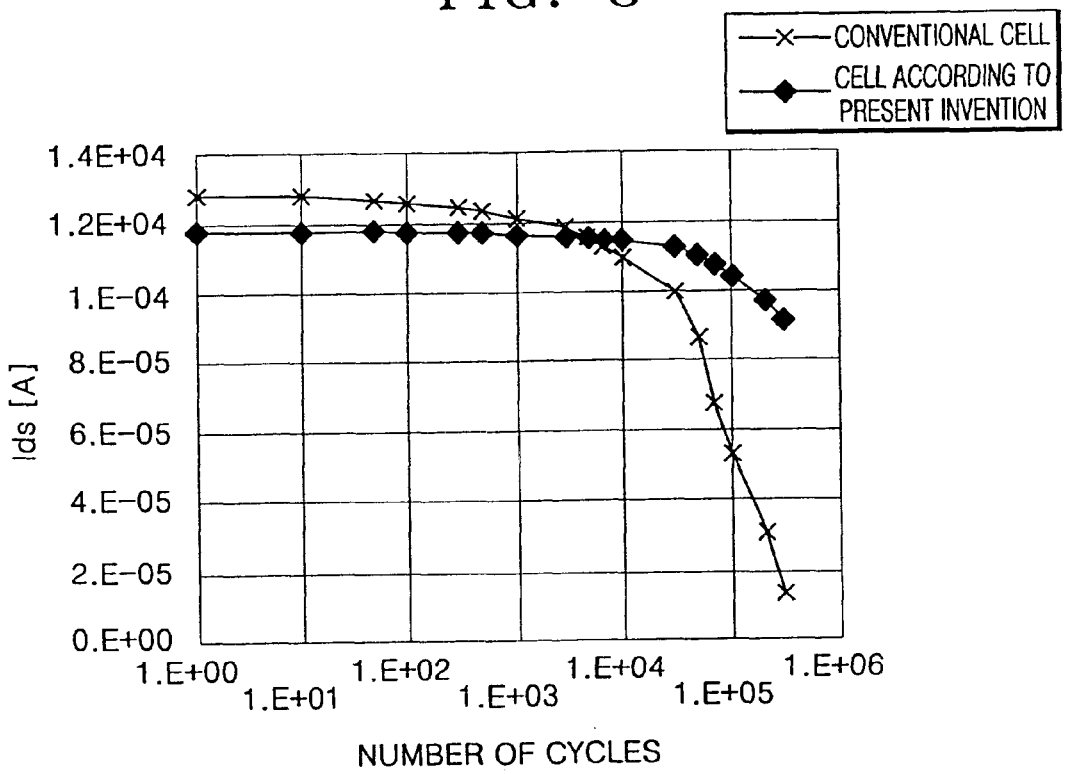
FIG. 8 is a graph depicting the endurance characteristics of the split gate type memory cell according to the embodiment of the present invention of FIG. 5C and the conventional split gate type memory cell of FIG. 3.

FIGS. 7 and 8 indicate the program characteristic and endurance characteristic of the memory cell manufactured according to the third embodiment, respectively. Referring to FIGS. 7 and 8, in the case where an active region according to the present invention is adopted, the program time is quickened compared with that of a conventional flash memory cell, while significantly improving the endurance characteristic.

As described in the foregoing, the split gate type flash memory according to the present invention makes the width of an active region in a portion in which a source expands under a floating gate as large as possible, thereby allowing for the increased program/erase efficiency and improved endurance characteristic.

Although this invention has been described with reference to preferred embodiments thereof showing the effect of expanding an active region in the illustrated embodiments the preferred embodiments are exemplary only, and should not be taken as limiting the scope of the invention. Specifically, those of ordinary skill in the art will recognize that various modifications may be made to the invention without departing from the spirit and the scope thereof.

What is claimed is:
1. A split gate type flash memory comprising:

a substrate;

a source, a drain and a channel provided over the substrate;

a gate insulating layer provided on the source, the drain and the channel;

a floating gate stacked on the gate insulating layer overlying the source and the channel;

an intergate insulating layer and a tunnel insulating layer stacked on the top and the side of the floating gate, respectively; and a control gate stacked on the intergate insulating layer, the tunnel insulating layer and the gate insulating layer, wherein an active region is formed so that the source underlying the floating gate is larger than the width of the channel under the control gate, except at a junction of the source underlying the floating gate and the channel under the control gate where the widths are the same.

2. A split gate type flash memory comprising:

a substrate;

a source, a drain and a channel provided over the substrate;

a gate insulating layer provided on the source, the drain and the channel;

a floating gate stacked on the gate insulating layer overlying the source and channel;

an intergate insulating layer and a tunnel insulating layer stacked on the top and side of the floating gate, respectively; and a control gate stacked on the intergate insulating layer, the tunnel insulating layer, and the gate insulating layer, wherein an active region is formed so that the source underlying the floating gate is larger than the width of the channel under the control gate, except at a junction of the source underlying the floating gate and the channel under the control gate where the widths are the same.

* * * * *